United States Patent [19]
Nilssen

[11] Patent Number: 5,489,823
[45] Date of Patent: * Feb. 6, 1996

[54] ELECTRONIC BALLAST FOR GAS DISCHARGE LAMP

[76] Inventor: Ole K. Nilssen, 408 Caesar Dr., Barrington, Ill. 60010

[ * ] Notice: The portion of the term of this patent subsequent to Nov. 17, 2009, has been disclaimed.

[21] Appl. No.: 997,138

[22] Filed: Dec. 22, 1992

Related U.S. Application Data

[63] Continuation of Ser. No. 751,587, Aug. 22, 1991, abandoned, which is a continuation of Ser. No. 546,267, Jun. 29, 1990, abandoned, which is a continuation-in-part of Ser. No. 787,692, Oct. 15, 1985, abandoned, which is a continuation of Ser. No. 644,155, Aug. 27, 1984, abandoned, which is a continuation of Ser. No. 555,426, Nov. 23, 1983, abandoned, which is a continuation-in-part of Ser. No. 330,599, Dec. 14, 1981, Pat. No. 4,441,087, which is a continuation of Ser. No. 973,741, Dec. 28, 1978, abandoned, which is a continuation-in-part of Ser. No. 890,586, Mar. 20, 1978, Pat. No. 4,184,128, said Ser. No. 751,587is a continuation-in-part of Ser. No. 717,860, Jun. 19, 1991, which is a continuation of Ser. No. 636,246, Dec. 31, 1990, abandoned, which is a continuation of Ser. No. 787,692, Oct. 15, 1985, said Ser. No. 555,426, is a continuation of Ser. No. 178,107, Aug. 14, 1980, abandoned, which is a continuation-in-part of Ser. No. 23,849, Mar. 26, 1979, Pat. No. 4,279,011.

[51] Int. Cl.⁶ .................................................. H05B 37/00
[52] U.S. Cl. .................... 315/227 R; 315/244; 315/247; 315/209 R
[58] Field of Search .................................. 315/226, 227, 315/244, 247, 171, 172, 174, 209 R, 219, 223, 239, DIG. 7; 363/65, 67, 68

[56] References Cited

U.S. PATENT DOCUMENTS

| | | | |
|---|---|---|---|
| 4,568,857 | 2/1986 | Head | 315/244 |
| 4,723,098 | 2/1988 | Grubbs | 315/244 |
| 4,743,809 | 5/1988 | Vlahos | 315/209 R |
| 4,888,525 | 12/1989 | Nilssen | 363/172 |
| 4,952,849 | 8/1990 | Fellows et al. | 315/244 |
| 5,041,766 | 8/1991 | Fiene et al. | 315/172 X |

Primary Examiner—Frank Gonzalez
Assistant Examiner—Reginald A. Ratliff

[57] ABSTRACT

A first half-bridge inverter is powered from an unfiltered full-wave-rectified ordinary 60 Hz electric utility power line voltage. This first inverter provides at a first inverter output, across which is series-connected a first tuned L-C circuit, a first squarewave voltage of fundamental frequency between about 30 and 33 kHz; which first squarewave voltage is magnitude-modulated at 120 Hz. The first tuned L-C circuit, which is series-resonant at about 30 kHz, is parallel-loaded by a full-wave high-frequency rectifier whose DC output is applied to substantially constant-magnitude DC voltage existing across a pair of energy-storing capacitors. At a constant 30 kHz inverter frequency, the waveshape of the current drawn from the power line is substantially that of a squarewave in phase with the power line voltage, thereby giving rise to a power factor of about 90%. However, by frequency-modulating the first inverter at 120 Hz, the waveshape of the line current is made to be substantially that of a sinewave in phase with the power line voltage, thereby giving rise to a power factor close to 100% and a total harmonic distortion of negligible magnitude. A second half-bridge inverter is powered from the substantially constant-magnitude DC voltage and provides at a second inverter output, across which is series-connected a second tuned L-C circuit, a second squarewave voltage of fundamental frequency between about 30 and 33 kHz. The second tuned L-C circuit, which is series-resonant at about 30 kHz, is parallel-loaded by three series-connected fluorescent lamps. The magnitude of the current supplied to these three lamps is adjustable be adjusting the frequency of the second inverter between about 30 and 33 kHz.

14 Claims, 3 Drawing Sheets

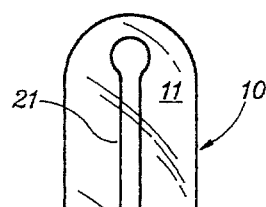
Fig. 1
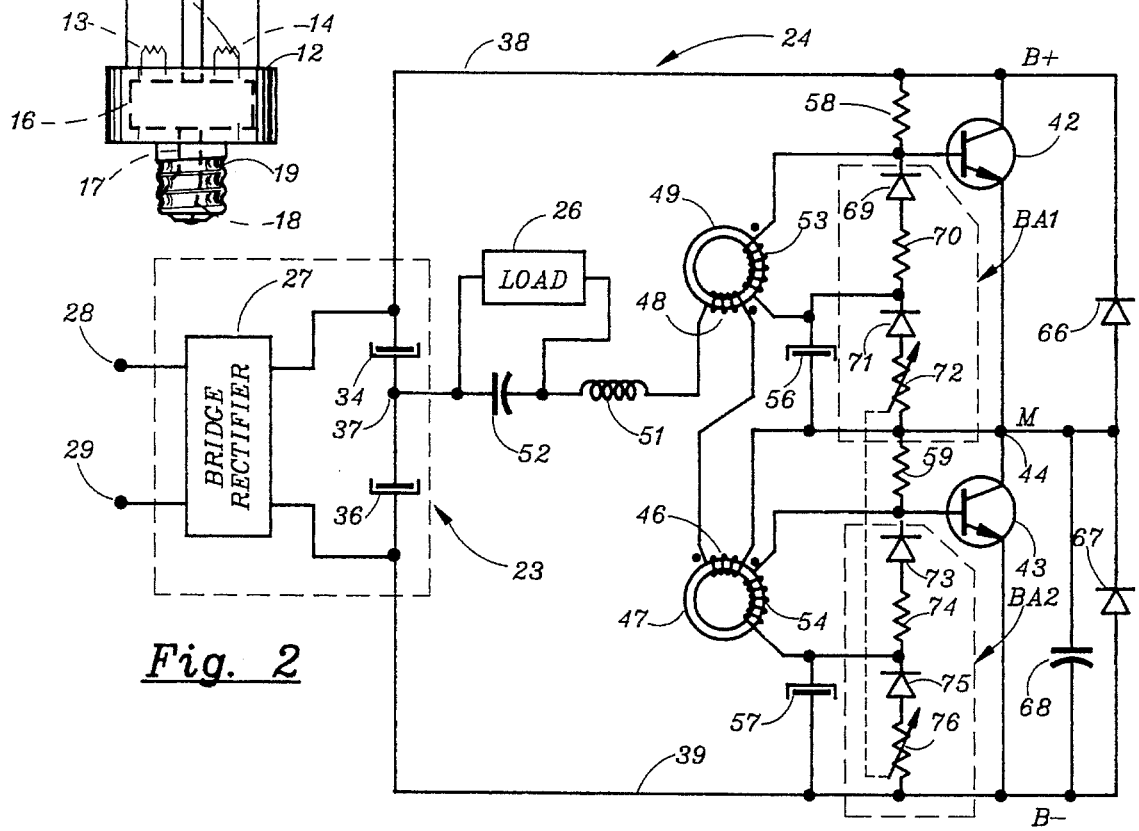
Fig. 2
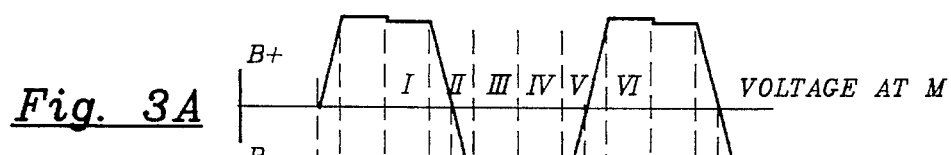
Fig. 3A — VOLTAGE AT M
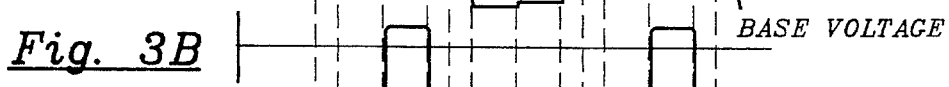
Fig. 3B — BASE VOLTAGE
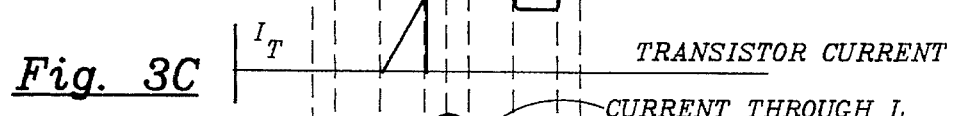
Fig. 3C — TRANSISTOR CURRENT
Fig. 3D — CURRENT THROUGH L / VOLTAGE ACROSS C 5,489,823

ELECTRONIC BALLAST FOR GAS DISCHARGE LAMP

RELATED APPLICATIONS

The present application is a continuation of Ser. No. 07/751,587 filed Aug. 22, 1991, now abandoned; which is a continuation of Ser. No. 07/546,267 filed Jun. 29, 1990, now abandoned; which is a continuation-in-part of Ser. No. 06/787,692 filed Oct. 15, 1985, now abandoned; which is a continuation of Ser. No. 06/644,155 filed Aug. 27, 1984, now abandoned; which is a continuation of Ser. No. 06/555,426 filed Nov. 23, 1983, now abandoned; which was a continuation of Ser. No. 06/178,107 filed Aug. 14, 1980, now abandoned; which application Ser. No. 07/751,587 is also a continuation-in-part of Ser. No. 07/717,860 filed Jun. 19, 1991; which is a continuation of Ser. No. 07/636,246 filed Dec. 31, 1990, now abandoned; which is a continuation of Ser. No. 06/787,692 filed Oct. 15, 1985, now abandoned; which is a continuation of Ser. No. 06/644,155 filed Aug. 27, 1984, now abandoned; which is a continuation of Ser. No. 06/555,426 filed Nov. 23, 1983, now abandoned; which is a continuation of Ser. No. 06/178,107 filed Aug. 14, 1980, now abandoned; which application Ser. No. 06/555,426 is also a continuation-in-part of Ser. No. 06/330,599 filed Dec. 14, 1981, now U.S. Pat. No. 4,441,087; which is a continuation of Ser. No. 973,741 filed Dec. 28, 1978, now abandoned; which is a continuation-in-part of Ser. No. 890,586 filed Mar. 20, 1978, now U.S. Pat. No. 4,184,128; which application Ser. No. 06/178,107 is also a continuation-in-part of Ser. No. 23,849 filed Mar. 26, 1979, now U.S. Pat. No. 4,279,011.

BACKGROUND OF THE INVENTION

Field of Invention

Instant invention relates to power-factor-corrected inverter-type fluorescent lamp ballasting means operable to be powered from an ordinary electric utility power line.

SUMMARY OF THE INVENTION

1. Objects of the Invention

An object of the present invention is that of providing a reliable cost-effective fluorescent lamp ballasting means.

This as well as other objects, features and advantages of the present invention will become apparent from the following description and claims.

2. Brief Description

In its preferred embodiment, instant invention comprises a first half-bridge inverter that is powered from an unfiltered full-wave-rectified ordinary 60 Hz electric utility power line voltage. This first inverter provides at a first inverter output, across which is series-connected a first tuned L-C circuit, a first squarewave voltage of fundamental frequency between about 30 and 33 kHz; which first squarewave voltage is magnitude-modulated at 120 Hz.

The first tuned L-C circuit, which is series-resonant at about 30 kHz, is parallel-loaded by a full-wave high-frequency rectifier whose DC output is applied to substantially constant-magnitude DC voltage existing across a pair of energy-storing capacitors.

At a constant 30 kHz inverter frequency, the waveshape of the current drawn from the power line is substantially that of a squarewave in phase with the power line voltage, thereby giving rise to a power factor of about 90%. However, by frequency-modulating the first inverter at 120 Hz, the waveshape of the line current is made to be substantially that of a sinewave in phase with the power line voltage, thereby giving rise to a power factor close to 100% and a total harmonic distortion of negligible magnitude.

A second half-bridge inverter is powered from the substantially constant-magnitude DC voltage and provides at a second inverter output, across which is series-connected a second tuned L-C circuit, a second squarewave voltage of fundamental frequency between about 30 and 33 kHz.

The second tuned L-C circuit, which is also series-resonant at about 30 kHz, is parallel-loaded by three series-connected fluorescent lamps. The magnitude of the current supplied to these three lamps is adjustable be adjusting the frequency of the second inverter between about 30 and 33 kHz.

BRIEF DESCRIPTION OF THE DRAWING

FIG. 1 schematically illustrates a compact, screw-in, self-ballasted fluorescent lamp assembly; which lamp may advantageously comprise the type of ballasting means represented by the present invention.

FIG. 2 is a schematic diagram of a half-bridge inverter and lasting circuit of the basic type used in the preferred embodiment of the present invention.

FIGS. 3A–3D illustrate the waveforms of various voltages and currents associated with the ballasting circuit of FIG. 2.

DESCRIPTION OF THE INVENTION

Figure 4:
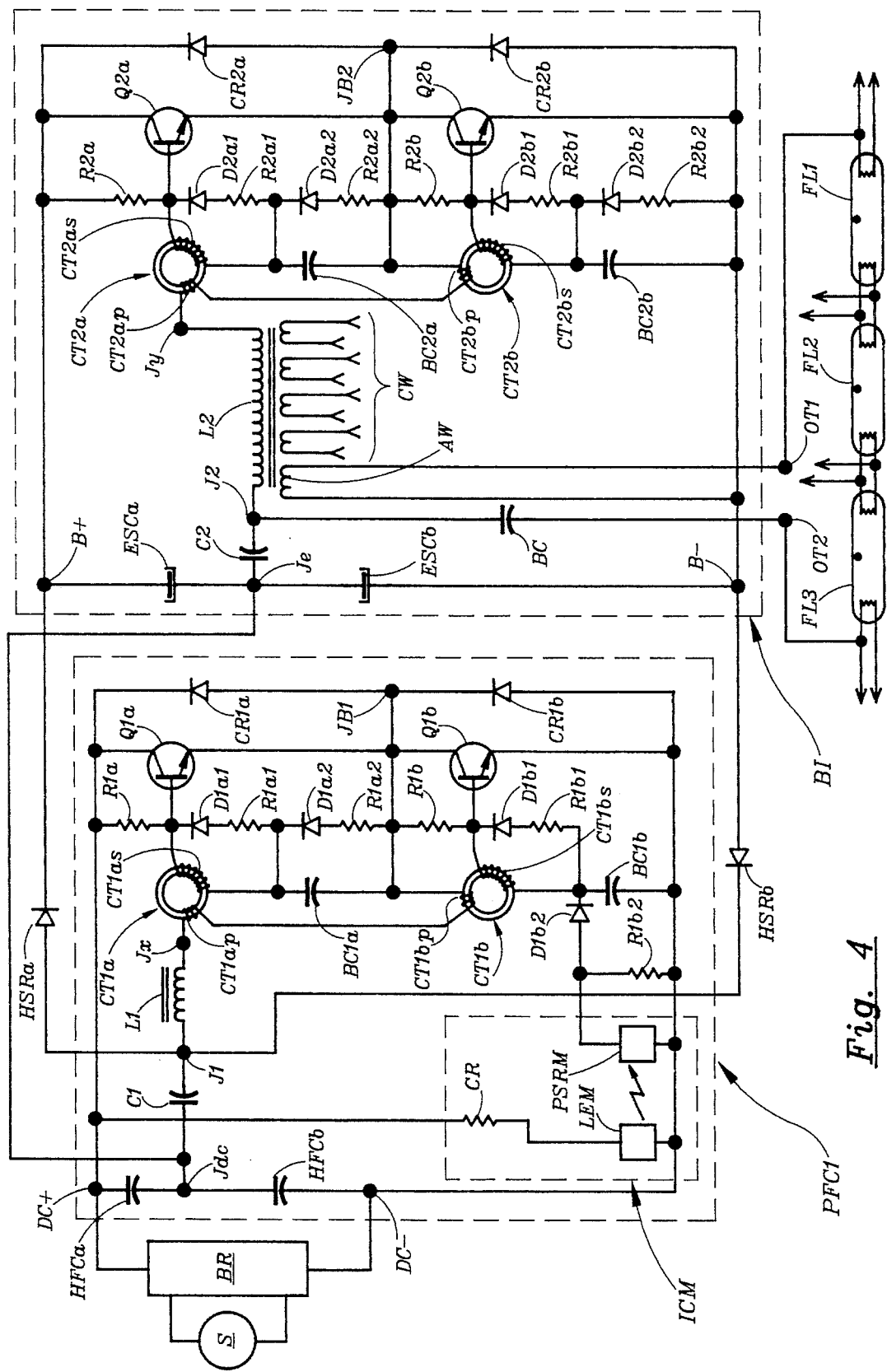
FIG. 4 illustrates the preferred embodiment of the present invention.

Details of Construction of Screw-in Fluorescent Lamp

FIG. 1 illustrates a screw-in gas discharge lamp unit 10 comprising a folded fluorescent lamp 11 secured to an integral base 12. The lamp comprises two cathodes 13, 14 which are supplied with the requisite high operating voltage from a frequency-converting power supply and ballasting circuit 16; which, because of its compact size, conveniently fits within base 12.

Circuit 16 is connected by leads 17, 18 to a screw-type plug 19 adapted for screw-in insertion into a standard Edison-type incandescent lamp socket at which ordinary 120 Volt/60 Hz power line voltage is available.

Details of Construction of the FIG. 2 Circuit

In FIG. 2, a power supply 23 is connected with the 120 Volt/60 Hz power line voltage and provides a center-tapped DC output voltage for supplying a high-efficiency half-bridge inverter circuit 24. The inverter circuit is operable to provide a high-frequency (20–30 kHz) high-magnitude current-limited voltage to a load 26, which actually represents fluorescent lamp 11 of FIG. 1.

Power supply 23 comprises bridge rectifier 27 which connects with 120 Volt/60 Hz power line terminals 28, 29 and provides full-wave rectified power line voltage to two series-connected filter capacitors 34, 36; which filter capacitors are: i) connected together at a center-tap 37, and ii) connected between a positive B+ bus 38 and a negative B– bus 39.

Inverter circuit 24 is a half-bridge inverter comprising transistors 42, 43 connected in series between the B+ bus and the B– bus. The collector of transistor 42 is connected to the B+ bus 38, the emitter of transistor 42 and the collector of transistor 43 are connected to a midpoint line 44 ("M"), and the emitter of transistor 43 is connected to the B− bus 39.

Midpoint line 44 is connected to center-tap 37 through a primary winding 46 of a toroidal saturable core transformer 47, a primary winding 48 on an identical transformer 49, a tank inductor 51 (L) and a series-connected tank capacitor 52 (C). Inductor 51 and capacitor 52 are energized upon alternate transistor conduction in manner to be described later. Load 26 is connected in parallel with capacitor 52.

Drive current to the base terminals of transistors 42 and 43 is provided by secondary windings 53, 54 of transformers 49, 47, respectively. Winding 53 is also connected to midpoint line 44 through a bias capacitor 56, while winding 54 is connected to the B− bus 39 through an identical bias capacitor 57. The base terminals of transistors 42 and 43 are also connected to lines 38 and 44 through bias resistors 58 and 59, respectively. Shunt diodes 66 and 67 are connected across the collector-emitter terminals of transistors 42 and 43, respectively. A capacitor 68 is connected across the collector-emitter terminals of transistor 43 to restrain the rate of voltage rise across those terminals.

A first optional biasing arrangement BA1 comprises a diode 69 connected with its cathode to the base of transistor 42 and with its anode to the cathode of a diode 71 by way of a resistor 70; the anode of diode 71 is connected with the emitter of transistor 42 by way of a resistor 72; the cathode of diode 71 is connected with the un-dotted side of secondary winding 53 of transformer 49. A second optional biasing arrangement BA2 comprises a diode 73 connected with its cathode to the base of transistor 43 and with its anode to the cathode of a diode 75 by way of a resistor 74; the anode of diode 75 is connected with the emitter of transistor 43 by way of a resistor 76; the cathode of diode 76 is connectred with the un-dotted side of secondary winding 54 of transformer 47.

Details of Operation of the FIG. 2 Circuit

The operation of the circuit of FIG. 2 can best be understood with additional reference to FIG. 3, which illustrates significant portions of the waveforms of the voltage at midpoint M (FIG. 3A), the base-emitter voltage on transistor 42 (FIG. 3B), the current through transistor 42 (FIG. 3C), and the capacitor 52 voltage and the inductor 51 current (FIG. 3D).

Starting at a point where transistor 42 first starts to conduct, current flows from the B+ bus 38 through windings 46 and 48 and inductor 51 to charge capacitor 52 and returns to the B+ bus through capacitor 34 (refer to the time period designated I in FIG. 3). When the saturable transformer 49 saturates at the end of period I, drive current to the base of transistor 42 will terminate, causing voltage on the base of the transistor to drop to the negative voltage stored on bias capacitor 56 in a manner to be described, causing this transistor to become non-conductive. As shown in FIG. 3c, current-flow in transistor 43 terminates at the end of period I.

However, since the current flowing through inductor 51 cannot change instantaneously, this current will now continue to flow from the B− bus 39 through capacitor 68, eventually causing the voltage at midpoint line 44 to drop to the voltage level on the B− bus (period II in FIG. 3). Thus, capacitor 68 restrains the rate of voltage change across the collector and emitter terminals of transistor 42.

The current through inductor 51 reaches its maximum value when the voltage at midpoint line 44 is zero. During period III, the current will continue to flow through inductor 51 but will be supplied from the B− bus through shunt diode 67. It will be appreciated that during the latter half of period II and all of period III, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive, thereby causeing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at midpoint 44 to rise (Period V). When the voltage at the midpoint line M reaches the voltage on the B+ bus, the current will then flow through shunt diode 66 (period VI). The cycle is then repeated.

As seen in FIG. 3, saturable transformers 47, 49 provide transistor drive current only after the current through inductor 51 has diminished to zero. Further, the the transistor drive current is terminated before the current through inductor 51 has reached its maximum amplitude. This coordination of base drive current and inductor current is achieved because of the series-connection between the inductor 51 and the primary windings 46, 48 of saturable transformers 47, 49, respectively.

The series-connected combination of inductor 51 and capacitor 52 is energized upon the alternate conduction of transistors 42 and 43. With a large value of capacitance of capacitor 52, very little voltage will be developed across its terminals. As the value of this capacitance is decreased, however, the voltage across this capacitor will increae. As the value of capacitor 52 is reduced to achieve resonance with inductor 51, the voltage on the capacitor will rise and become infinite in a loss-free circuit operating under ideal conditions.

It has been found desirable to regulate the transistor inversion frequency, determined mainly by the saturation time of saturable transformers 47, 49, to be equal to or higher than the natural resonance frequency of the inductor and capacitor combination in order to provide a high voltage output to external load 26.

Due to so-called Q-multiplication, a high-magnitude voltage develops across capacitor 52 as the transistor inversion frequency approaches the natural resonance frequency of the series-combination of inductor 51 and capacitor 52.

When inverter circuit 24 is used in the self-ballasted fluorescent lamp of FIG. 1, it has been found that the inversion frequency may be about equal to the natural resonance frequency of the series L-C tank circuit consisting of inductor 51 and capacitor 52. However, if the capacitance value of capacitor 52 is reduced below the point of resonance, unacceptably high transistor currents will result and transistor burn-out will occur.

The sizing of capacitor 52 is determined by the particular application of inverter circuit 24; but, as long as the combined load presented to the output of inverter transistors 42, 43, has an effective inductance value sufficient to provide adequate energy storage for self-sustained transistor inverter action, the current-feedback provided by saturable transformers 47, 49 will effect alternate transistor conduction without the need for additional voltage-feedback.

Because the voltages across transistors 42, 43 are relatively low (due to the absolute voltage-clamping effect of capacitors 34, 36), the half-bridge inverter 24 is very reliable. The absence of switching transients minimizes the possibility of transistor burn-out.

Inverter circuit 24 comprises means for supplying reverse bias to the conducting transistor upon saturation of its associated saturable transformer. For this purpose, capacitors 56 and 57 are charged to negative voltages as a result of reset currents flowing into secondary windings 53, 54 from the bases of transistors 42, 43, respectively. This reverse current rapidly turns off a conducting transistor to increase its switching speed and to achieve high inverter switching efficiency.

When a transistor base-emitter junction is reversely biased, it exhibits the characteristics of a Zener diode, having a reverse breakdown voltage on the order of 8 to 14 Volt for transistors typically used in high-voltage inverters.

Since load 56 comprises a fluorescent lamp, the maximum magnitude of the voltage across capacitor 52 will be limited by the lamp's ignition and operating characteristics, thereby effectively preventing voltages across inductor 51 and capacitor 52 from ever reaching destructive levels.

The above-presented explanation of the operation of the FIG. 2 inverter circuit was based on the two biasing arrangements (BA1 and BA2) being non-connected.

With these biasing arrangements actually connected as indicated, the inverter's operation will become independent of the exact magnitudes of the transistors' base-emitter Zenering voltages. Instead, the magnitude of the negative bias voltage established on each of capacitors 56 and 57 can now be chosen by choice of resistance value of resistor 72 and/or resistor 76: the lower the resistance value, the lower the magnitude of the associated negative bias voltage; and, in turn, the longer the transistors' ON-time, the lower the inverter's self-oscillating frequency, and the higher the magnitudes of the inverter's output current and power.

By providing for means whereby the resistance values of resistors 72 and 76 can be manually adjusted (in tandem and/or individually), the power provided to the fluorescent lamp may be correspondingly adjusted: the lower the resistance values, the more power provided to the lamp.

Moreover, due to the negative feedback effect inherently provided by resistors 72 and 74, the inverter may be made to operate safely even with the fluorescent lamp being non-connected.

This negative feedback effect is due to the fact that, as the magnitude of the current flowing through the L-C circuit increases, the magnitudes of the drive currents provided to the transistors' bases increase, and the magnitudes of the currents drawn out of capacitors 56 and 57 increase correspondingly; which, in turn, increases the magnitudes of the negative bias voltages present on these capacitors to the point where the magnitudes of the currents flowing through resistors 72 and 76 equal those of the increased base currents. However, the increased negative bias voltages will inherently shorten the transistors' ON-times; which, in turn, will increase the inverter frequency, thereby reducing the inverter's output current; etc. In other words, the indicated biasing arrangements provide for an automatic self-limiting of the magnitude of the inverter's output current.

Additional Comments re the FIG. 2 Circuit a) With commonly available components, inverter circuit 24 can be made to operate efficiently at any frequency between a few kHz to perhaps as high as 50 kHz. However, for various well-known reasons (i.e., eliminating audible noise, minimizing physical size, and maximizing efficiency), the frequency actually chosen for the lamp unit of FIG. 1 was in the range of 20 to 30 kHz.

b) The fluorescent lighting unit of FIG. 1 could be made in such manner as to permit fluorescent lamp 11 to be disconnectable from its base 12 and ballasting means 16. However, if powered with normal line voltage without its lamp load connected, frequency-converting power supply and ballasting circuit 16 is apt to self-destruct.

To avoid such self-destruction, arrangements can readily be made whereby the very act of removing the load automatically establishes a situation that prevents the possible destruction of the power supply and ballasting means. For instance, with the tank capacitor (52) being permanently connected with the lamp load (11)—thereby automatically being removed whenever the lamp is removed—the inverter circuit is protected from self-destruction.

c) At frequencies above a few kHz, the load represented by a fluorescent lamp—once it is ignited—is substantially resistive. Thus, with the voltage across lamp 11 being of a substantially sinusoidal waveform (as indicated in FIG. 3d), the current through the lamp will also be substantially sinusoidal in waveshape.

d) In the fluorescent lamp unit of FIG. 1, fluorescent lamp 11 is connected with power supply and ballasting circuit 16 in the exact same manner as is load 26 connected with the circuit of FIG. 2. That is, it is connected in parallel with the tank capacitor (52) of the L-C series-resonant circuit. As is conventional in instant-start fluorescent lamps—such as lamp 11 of FIG. 1—the two terminals from each cathode are shorted together, thereby to constitute a situation where each cathode effectively is represented by only a single terminal. However, it is not necessary that the two terminals from each cathode be shorted together; in which case—for instant-start operation— connection from a lamp's power supply and ballasting means need only be made with one of the terminals of each cathode.

e) It is noted that the transistor's ON-time is shorter than half the period of the inverter's high frequency squarewave voltage output; which voltage output is illustrated by FIG. 3A.

The fact that each of the transistors' ON-times is shorter than half the period of the inverter's high frequency output voltage (or output current) is important: it inherently provides for a situation where the two transistors are manifestly prevented from conducting at the same time, thereby providing protection against circuit failure due to excess-magnitude transistor currents.

f) By adjusting the resistance values of resistors 72 and/or 76, the ON-times of the associated transistors are adjusted accordingly. For instance, by increasing the resistance value of resistor 76, the ON-time associated with transistor 43 is shortened; and, as a result, the magnitude of the current prvided to the load 26 is reduced.

Details of Construction of the Preferred Embodiment

In FIG. 4, a source S represents an ordinary electric utility power line providing 120 Volt/60 Hz power line voltage to the input of a bridge rectifier BR, whose DC output is applied between a DC– bus and a DC+ bus.

A high-frequency filter capacitor HFCa is connected between a junction Jdc and the DC+ bus; a high-frequency filter capacitor HFCb is connected between the DC– bus and junction Jdc.

A tank capacitor C1 is connected between junction Jdc and a junction J1; a tank inductor L1 is connected between junction J1 and a junction Jx.

A transistor Q1a is connected with its collector to the DC+ bus and with its emitter to a junction bus JB1; a transistor Q1b is connected with its collector to junction bus JB1 and with its emitter to the DC– bus. A commutating rectifier CR1a is connected with its cathode to the DC+ bus and with its anode to junction bus JB1; a commutating rectifier CR1b is connected with its cathode to junction bus JB1 and with its anode to the DC− bus.

Primary windings CT1ap and CT1bp of saturable current transformers CT1a and CT1b, respectively, are series-connected between junction Jx and junction bus JB1.

Secondary winding CT1as of transformer CT1a is connected between the base of transistor Q1a and the cathode of a diode D1a2, whose anode is connected with junction bus JB1 via a resistor R1a2. A diode D1a1 is connected with its cathode to the base of transistor Q1a and with its anode to the cathode of diode D1a2 via a resistor R1a1. A resistor R1a is connected between the DC+ bus and the base of transistor Q1a. A bias capacitor BC1a is connected between the cathode of diode D1a2 and junction bus JB1.

Secondary winding CT1bs of transformer CT1b is connected between the base of transistor Q1b and the cathode of a diode D1b2, whose anode is connected with the DC− bus via a resistor R1b2. A diode D1b1 is connected with its cathode to the base of transistor Q1b and with its anode to the cathode of diode D1b2 via a resistor R1b1. A resistor R1b is connected between junction bus JB1 and the base of transistor Q1b. A bias capacitor BC1b is connected between the cathode of diode D1b2 and the DC-bus.

A high-speed rectifier HSRa is connected with its anode to junction J1 and with its cathode to a B+ bus; a high-speed rectifier HSRb is connected with its cathode to junction J1 and with its anode to a B− bus.

An energy-storing capacitor ESCa is connected between a junction Je and the B+ bus, junction Je being connected with junction Jdc; an energy-storing capacitor ESCb is connected between junction Je and the B− bus.

A tank capacitor C2 is connected between junction Je and a junction J2; a tank inductor is connected between junction J2 and a junction Jy.

A transistor Q2a is connected with its collector to the B+ bus and with its emitter to a junction bus JB2; a transistor Q2b is connected with its collector to junction bus JB2 and with its emitter to the B− bus. A commutating rectifier CR2a is connected with its cathode to the B+ bus and with its anode to junction bus JB2; a commutating rectifier CR2b is connected with its cathode to junction bus JB2 and with its anode to the B-bus.

Primary windings CT2ap and CT2bp of saturable current transformers CT2a and CT2b, respectively, are series-connected between junction Jy and junction bus JB2.

Secondary winding CT2as of transformer CT2a is connected between the base of transistor Q2a and the cathode of a diode D2a2, whose anode is connected with junction bus JB2 via a resistor R2a2. A diode D2a1 is connected with its cathode to the base of transistor Q2a and with its anode to the cathode of diode D2a2 via a resistor R2a1. A resistor R2a is connected between the B+ bus and the base of transistor Q2a. A bias capacitor BC2a is connected between the cathode of diode D2a2 and junction bus JB2.

Secondary winding CT2bs of transformer CT2b is connected between the base of transistor Q2b and the cathode of a diode D2b2, whose anode is connected with the B-bus via a resistor R2b2. A diode D2b1 is connected with its cathode to the base of transistor Q2b and with its anode to the cathode of diode D2b2 via a resistor R2b1. A resistor R2b is connected between junction bus JB2 and the base of transistor Q2b. A bias capacitor BC2b is connected between the cathode of diode D2b2 and the B-bus.

An auxiliary winding AW is wound as a loosely coupled secondary winding on tank inductor L2 and connected between the B− bus and an output terminal OT1. A DC blocking capacitor BC is connected between junction J2 and an output terminal OT2.

Also wound on tank inductor L2 are four cathode windings CW; which four cathode windings are connected with corresponding pairs of cathode terminals of three series-connected fluorescent lamps FL1, FL2 and FL3; which three fluorescent lamps are series-connected across output terminals OT1 and OT2.

An inverter control means ICM is connected between the DC-bus and the DC+ bus, as well as with the anode of diode D1b2; which inverter control means consists of: (i) a photo-sensitive resistive means PSRM connected between the anode of diode D1b2 and the DC− bus; and (ii) a light-emitting means LEM, such as a light-emitting diode (or LED), connected in series with a control resistor CR between the DC− bus and the DC+ bus. Light-emitting means LEM is so positioned and arranged that its light output impinges on a light-receptive part of photo-sensitive resistive means PSRM.

The half-bridge inverter with Q1a and Q1b as its switching transistors is identified as power-factor-correcting inverter PFCI; and the half-bridge inverter with Q2a and Q2b as its switching transistors is identified as ballast inverter BI.

Details of Operation of the Preferred Embodiment

Figure 5:
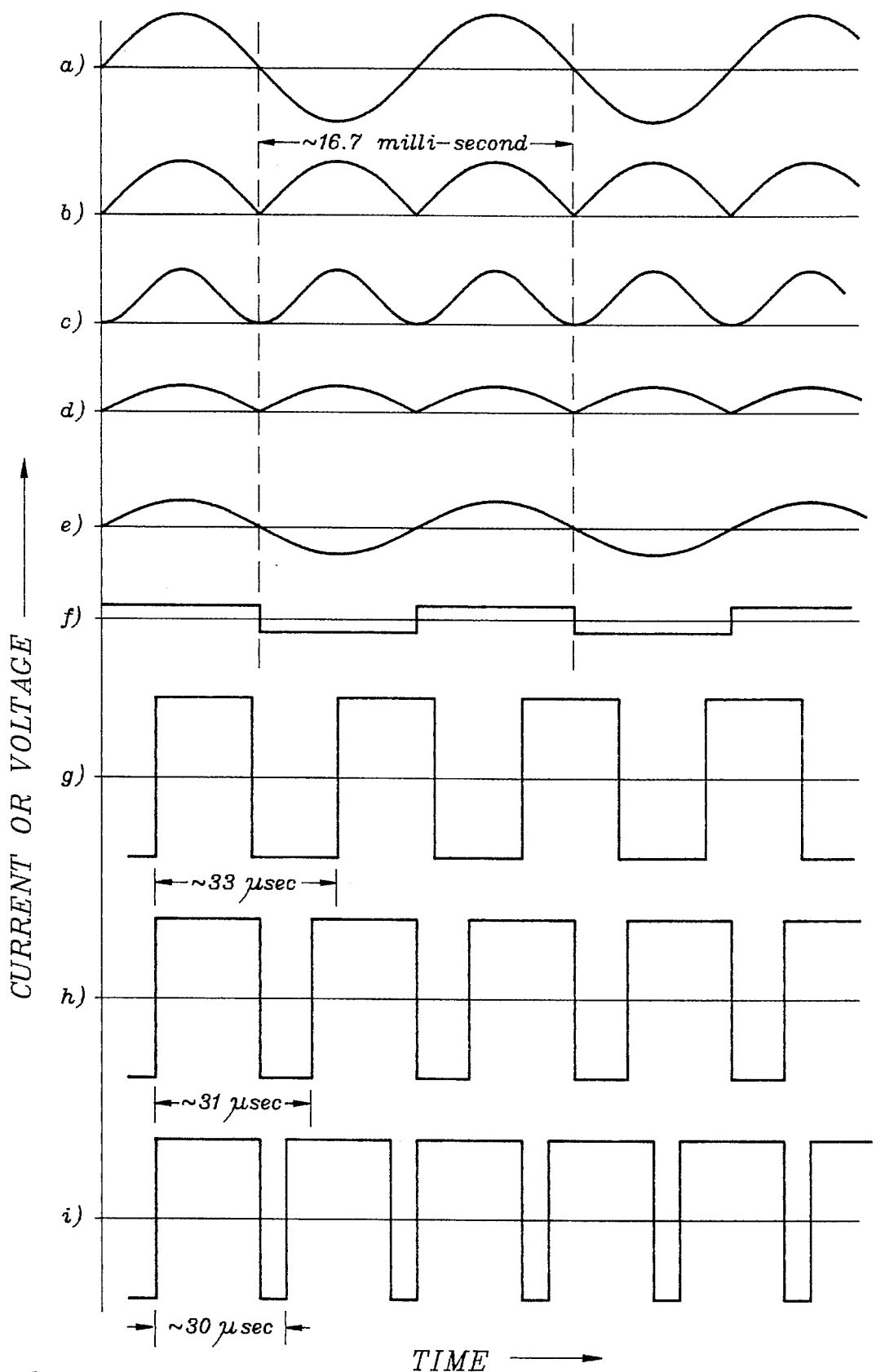
FIG. 5(a–i) illustrates various voltage and current waveforms associated with the operation of the preferred embodiment of the present invention.

The operation the preferred embodiment of instant invention may best be understood when read with reference to FIG. 5; which illustrates various current and voltage waveforms associated with the operation of the circuit arrangement of FIG. 4.

With reference to the waveforms of FIG. 5 and the circuit arrangement of FIG. 4, as long as the magnitude of the DC voltage existing between the B− bus and the B+ bus remains substantially constant, waveform: (a) represents that of the 120 Volt/60 Hz power line voltage supplied from source S; (b) represents the corresponding DC voltage present between the DC− bus and the DC+ bus; (c) represents the net current provided via high-speed rectifiers HSRa and HSRb to energy-storing capacitors ESCa and ESCb; (d) represents the current drawn from the DC output of bridge rectifier BR; and (e) represents the waveform of the current drawn from source S. Waveform (f) represents the current that would be drawn from source S in case the light from light-emitting means LEM were to be kept at a constant intensity, such as would occur if a filter capacitor were to be connected thereacross.

The two half-bridge inverters (PFCI and BI) both operate in the same basic manner as does the half-bridge inverter of FIG. 2.

In case of the PFCI inverter, the load constitutes the substantially constant-magnitude DC voltage present across energy-storing capacitors ESCa and ESCb; in case of the BI inverter, the principal load constitutes the three series-connected fluorescent lamps FL1, FL2 and FL3.

In the overall operation of the circuit of FIG. 4, the PFCI inverter continually charges the two energy-storing capacitors (ESCa/ESCb), while the BI inverter continually discharges these same energy-storing capacitors. Thus, the magnitude of the DC voltage across these energy-storing capacitors will stabilize at a point where the average rate of capacitor-charging equals the average rate of capacitor-discharging.

While the average rate of capacitor-charging is essentially fixed for a given magnitude of the voltage supplied by the source (S), the average rate of capacitor-discharging increases with increasing magnitude of the DC voltage present across the energy-storing capacitors (i.e., between the B− bus and the B+ bus).

Absent any control by inverter control means ICM, a basic characteristic of the series-driven parallel-loaded PFCI inverter powering a constant-voltage-magnitude load, such as indeed represented by capacitors ESCa/ESCb, is that the instantaneous magnitude of the current provided to this load will be roughly proportional to the instantaneous magnitude of the DC voltage powering the inverter. Thus, absent control, the magnitude of the charging current supplied to capacitors ESCa/ESCb will vary in proportion with the magnitude of the DC voltage present between the DC− bus and the DC+ bus.

However, another basic characteristic of the PFCI inverter is that, with a constant-magnitude DC voltage present between the DC− bus and the DC+ bus, the magnitude of the charging current supplied to capacitors ESCa/ESCb is roughly proportional to the conductance of photo-sensitive resistive means PSRM; which, in turn, is roughly proportional to the amount of light emitted from light-emitting means LEM; which, in turn, is roughly proportional to the magnitude of the current flowing through light-emitting means LEM; which, in turn, is roughly proportional to the magnitude of the DC voltage present between the DC− bus and the DC+ bus.

Thus, with the amount of light emitted by light-emitting means LEM being roughly proportional to the instantaneous magnitude of the DC voltage present between the DC− bus and the DC+ bus, the instantaneous magnitude of the charging current supplied to capacitor ESCa/ESCb will be roughly proportional to the square of the instantaneous magnitude of that DC voltage.

As an overall consequence, the instantaneous magnitude of the current drawn by the PFCI inverter will be roughly proportional to the instantaneous magnitude of the DC voltage present betwen the DC− bus and the DC+ bus; which is to say that the instantaneous magnitude of the current drawn from the power line (i.e., source S) will be proportional to the instantaneous magnitude of the voltage provided from the power line; which, in turn, provides for the power drawn from the power line by the circuit arrangement of FIG. 4 to exhibit a power factor close to unity (i.e., 100%). Moreover, the waveform of the current drawn from the power line will exhibit an exceptionally low degree of harmonic distortion.

In effecting its control action, inverter control means ICM causes both symmetry-modulation and frequency-modulation of the inverter output voltage-provided between junction Jdc and junction Jx. As illustrated by FIG. 5(g), this inverter output voltage is a nearly symmetrical squarewave of a certain frequency (about 30 kHz) whenever the instantaneous magnitude of the DC voltage between the DC− bus and the DC+ bus is at its maximum (about 170 Volt). However, with the instantaneous magnitude of this DC voltage being about half its maximum, the inverter output voltage—as illustrated by FIG. 5(h)—is a clearly assymmetrical squarewave. Moreover, its frequency is now higher (about 32 kHz). As indicated by FIG. 5(i), at a still lower magnitude of the DC voltage between the DC− bus and the DC+ bus, the inverter output voltage is still more assymmetrical and of still higher frequency.

Thus, the PFCI inverter effects its control action by a combination of symmetry-modulation and frequency-modulation.

Increasing frequency—other things being equal—provides for reduced-magnitude charging current to energy-storing capacitors ESCa/ESCb. This is so for the reason that the natural series-resonance-frequency of the L2-C2 tuned circuit is below the inverter's actual frequency Increasing asymmetry—other things being equal—also provides for reduced-magnitude charging current to energy-storing capacitors ESCa/ESCb. This is so for the reason that the magnitude of the fundamental frequency component of the inverter's output voltage decreases roughly in proportion to the degree of asymmetry.

As the degree of conductance of photo-sentitive resistive means PSRM increases, the magnitude of the negative bias voltage present across bias capacitor BC1b decreases; which results in a longer ON-time for transistor Q1b.

As for the BI inverter, the operation is substantially as described in connection with the circuit of FIG. 2, except for the particular feature associated with auxiliary winding AW.

The phasing of the AW winding is such that the fundamental frequency component of the high-frequency voltage provided at output terminal OT1 is substantially out-of-phase with the high-frequency voltage provided at output terminal OT2. That way, the magnitude of the net voltage provided across the three series-connected lamps is larger than it would be if the lamps had been connected directly across tank capacitor C2.

In case of ordinary F40 or F34 T-12 Rapid-Start fluorescent lamps, each lamp requires an operating voltage of RMS magnitude equal to about 100 Volt; which implies a total RMS magnitude of about 300 Volt across the three series-connected lamps.

To reduce potentially dangerous electric shock effects, as might result from capacitive coupling directly from the glass envelope of the fluorescent tube to the hand of a person installing and/or removing the fluorescent lamps from their sockets, it is important that the magnitude of the lamp's arc voltage be not much higher than about 200 Volt RMS (at about 30 kHz) with respect to ground. If it were to exceed this 200 Volt RMS magnitude, a person might receive a potentially dangerous electric shock effect merely from grabbing the fluorescent tube at a point where the potential of the ionized gas inside the glass envelope were higher than 200 Volt RMS with respect to ground.

In the particular arrangement of FIG. 4, the maximum magnitude of the 30 kHz potential of the ionized gas within the fluorescent glass tube is indeed maintained below approximately 200 Volt RMS with respect to ground, in spite of the fact that the three lamps require an operating voltage of 300 Volt RMS magnitude. This result has been achieved by way of the AW winding, whose output voltage—during lamp operation—is about 100 Volt RMS with respect to the B− bus; which, with respect to the 30 kHz inverter voltage, is indeed at ground potential.

On the other hand, the magnitude of the voltage contributed by the AW winding should be as low as reasonably possible for the reason that its waveform is of such nature as to cause degradation of the lamp current crest factor; which degradation is due to the fact that—contrary to the case with the voltage across the tank capacitor (C2)—the waveshape of the voltage present across the tank inductor (L2) includes the full magnitude of the squarewave voltage provided at the inverter's output (i.e., the voltage provided between junctions Je and Jy).

With the DC voltage provided between the B− bus and the B+ bus being of substantially constant magnitude, the lamp current crest factor would be about 1.5 if the lamps were to have been connected directly across the tank capacitor. However, had the lamps instead been connected directly across the tank inductor, the lamp current crest factor would have been far in excess of 1.7; which is normally considered the maximum permissible level for lamp current crest factor. On the other hand, with only one third of the lamp voltage derived from the tank inductor voltage, and with the remaining two thirds being derived from the tank capacitor voltage, the net resulting lamp current crest factor is kept just below 1.7—as is indeed the case in the arrangement of FIG. 4.

Additional Comments (a) The reason that the AW winding is loosely coupled with tank inductor L2 is related to minimizing detrimental effects on lamp current crest factor due to powering the lamps in part by the tank inductor voltage. By effectively providing the tank inductor voltage to the fluorescent lamp via a series inductance, the detrimental effects on lamp current crest factor are indeed reduced. However, the same result can be obtained by placing an inductor in series with the fluorescent lamps.

(b) Light-emitting means LEM is likely not to be totally linear in terms of light output as function of the magnitude of the driving DC current. Likewise, photo-sensitive resistive means is likely not to be totally linear with respect to its effective conductance versus amount of light received. In addition, the symmetry-modulation and frequency-modulation resulting from changes in the conductance of the photo-sensitive resistive means are not likely to be totally linear.

However, it is not necessary that these various relationships be totally linear. Instead, the largest part of the sought-after effect—namely power factor correction and reduction of power line harmonics—will result even if the various relationships be quite non-linear.

Of course, by carefully selecting and matching the non-linearities of the different effects, as well as by introducing various linearizing means, nearly any desired degree of final power factor correction can be achieved.

(c) The time constant associated with bias capacitor BC1b and its associated charge leakage means—namely resistor R1b2 and photo-sensitive resitive means PSRM—must be long with respect to a complete cycle of the 30 kHz inverter frequency. However, this time constant should be short compared with a complete cycle of the 120 Hz ripple voltage on the DC voltage present between the DC− bus and the DC+ bus.

(d) The waveshape of the high-frequency current flowing from tank capacitor C1 of FIG. 4 is substantially sinusoidal— with the positive halves flowing though rectifier HSRa and the negative halves flowing through rectifier HSRb.

(e) The absolute instantaneous magnitude of the high-frequency current flowing from junction J1 and through rectifiers HSRa and HSRb is—except for any imperfections in the HSRa/HSRb rectifiers—equal to that of the net DC current flowing into energy-storing capacitors ESCa and ESCb.

(f) The waveshape of the current flowing through the three series-connected fluorescent lamps is also nearly sinusoidal; except that a modest degree of distortion is introduced by the harmonics of the component of high-frequency voltage provided by auxiliary winding AW. However, as long as the magnitude of this component is kept relatively small compared with the magnitude of the voltage provided from the tank capacitor— say, no higher than about 50% thereof—the distortion of the lamp current is insufficient to cause significant deterioration of the lamp current crest factor.

(g) Each of transistors Q1a and Q1b (as combined with their respective commutating rectifiers CR1a and CR1b) acts as a rapidly operating ON-OFF switch—current flowing through one or the other transistor, but never through both transistors at the same time. The forward conduction time of transistor Q1b decreases as the absolute magnitude of the negative bias voltage on bias capacitor BC1b increases. Thus, with the instantaneous magnitude of the DC voltage present between the DC− bus and the DC+ bus being substantially equal to that of the AC power line voltage provided from source S, the absolute magnitude of this bias voltage varies synchronously with that of the AC power line voltage; thereby, in turn, causing the effective ON-time of transistor Q1b to vary synchronously with the absolute magnitude of the AC power line voltage as well.

(h) It is important that the natural resonance frequencies of the L1-C1 and the L2-C2 series-tuned circuits of FIG. 4 are lower than (or at least not higher than) the operating (or switching) frequencies of the PFCI and the BI inverters, respectively.

(i) It is believed that the present invention and its several attendant advantages and features will be understood from the preceeding description. However, without departing from the spirit of the invention, many changes may be made in its form and in the selection, construction and interrelationships of is constituent parts, the form herein presented merely representing the presently preferred embodiment.

I claim:

1. An arrangement comprising:

first rectifier means connected with a source of power line voltage and operative to provide a first DC voltage at a first set of DC terminals;

power conditioner means connected with the first DC terminals and operative to provide a high-frequency output voltage at a high-frequency output; the high-frequency output voltage having a fundamental frequency substantially higher than that of the power line voltage; the power conditioner means including tuned L-C circuit means having a tank inductor and a tank capacitor; a capacitor voltage existing across the tank capacitor; the tank inductor having an auxiliary winding; an auxiliary voltage existing across the auxiliary winding; the high-frequency output voltage being the sum of the capacitor voltage and the auxiliary voltage; the magnitude of the high-frequency output voltage thereby being substantively higher than that of the capacitor voltage by itself; and gas discharge lamp means connected with the high-frequency output and operative to be powered by the high-frequency output voltage provided thereat.

2. An arrangement comprising:

rectifier means connected with a source of power line voltage and operative to provide a DC voltage at a set of DC terminals;

power conditioner means connected with the DC terminals and operative to provide a high-frequency output voltage at a high-frequency output; the high-frequency output voltage having a fundamental frequency substantially higher than that of the power line voltage; the power conditioner means including a tuned L-C circuit having a tank inductor and a tank capacitor; a capacitor voltage existing across the tank capacitor; the tank inductor having an auxiliary winding; the auxiliary winding being characterized by not being connected across the terminals of a thermionic cathode; an auxiliary voltage existing across the auxiliary winding; the high-frequency output voltage being the sum of the capacitor voltage and the auxiliary voltage; and gas discharge lamp operative to connect with the high-frequency output and to be powered by the high-frequency output voltage provided thereat.

3. The arrangement of claim 2 wherein the RMS magnitude of the high-frequency output voltage is substantially higher than the RMS magnitude of the capacitor voltage.

4. The arrangement of claim 3 where the RMS magnitude of the high-frequency output voltage is at least 25 percent higher than the RMS magnitude of the capacitor voltage.

5. The arrangement of claim 2 wherein the tuned L-C circuit has a natural resonance frequency equal to or lower than the fundamental frequency of the high-frequency output voltage.

6. An arrangement comprising:

first rectifier means connected with a source of power line voltage and operative to provide a first DC voltage at a first set of DC terminals;

power conditioner means connected with the first DC terminals and operative to provide a high-frequency output voltage at a high-frequency output; the high-frequency output voltage having a fundamental frequency substantially higher than that of the power line voltage; the power conditioner means including inverter means connected with the first set of DC terminals and operative to provide the high-frequency output voltage; the inverter means including tuned L-C circuit means having a tank inductor series-connected with a tank capacitor; a capacitor voltage existing across the tank capacitor; the tank inductor having an auxiliary winding; an auxiliary voltage existing across the auxiliary winding; the high-frequency output voltage being the sum of the capacitor voltage and the auxiliary voltage, thereby to attain an RMS magnitude substantially higher than that of the capacitor voltage by itself; and gas discharge lamp operative to connect with the high-frequency output and to be powered by the high-frequency output voltage provided thereat.

7. An arrangement comprising:

a first sub-assembly having power input terminals and DC output terminals; the power input terminals being connected with a pair of power line terminals across which exists an AC power line voltage; the DC output terminals being connected with the power input terminals by way of a rectifier and a waveshaping circuit; the waveshaping circuit being operative to cause a substantially sinusoidal current to be drawn by the power input terminals from the power line terminals; the substantially sinusoidal current having a waveform characterized by exhibiting less than 10% total harmonic distortion;

a second sub-assembly connected with the DC terminals and operative to provide a high-frequency voltage at a pair of inverter terminals; the high-frequency voltage having a fundamental frequency substantially higher than that of the AC power line voltage; and a third sub-assembly connected with the inverter terminals and operative to supply a high-frequency output voltage at a pair of output terminals; at least three gas discharge lamps being series-connected across the output terminals; the third sub-assembly being operative to cause the three series-connected gas discharge lamps to be ignited and subsequently to be supplied with high-frequency lamp current.

8. The arrangement of claim 7 wherein (i) each gas discharge lamp includes a thermionic cathode with a pair of cathode terminals, and (ii) the third sub-assembly is further characterized by having terminals connected with each of the cathode terminals.

9. The arrangement of claim 7 wherein the second sub-assembly is further characterized by including an energy-storing inductor connected in circuit between the power input terminals and the DC output terminals.

10. The arrangement of claim 7 wherein the rectifier has a first pair and a second pair of rectifier terminals; the first pair of rectifier terminals being connected with the power input terminals; the second pair of rectifier terminals being connected with the waveshaping circuit.

11. The arrangement of claim 10 wherein the first sub-assembly is additionally characterized in that (i) a unidirectional voltage exists between the second pair of rectifier terminals, and (ii) the absolute instantaneous magnitude of this unidirectional voltage is substantially equal to that of the AC power line voltage.

12. The arrangement of claim 7 wherein the first subassembly is further characterized by including an intermittently conducting transistor connected in circuit between the power input terminals and the DC output terminals.

13. The arrangement of claim 12 wherein an energy-storing inductor is connected in circuit with the intermittently conducting transistor.

14. The arrangement of claim 7 wherein the first subassembly is further charactized by including a pair of terminals across which, at least under some conditions, exists a non-symmetrical squarewave voltage.

* * * * *